(12) United States Patent
Loh et al.

(10) Patent No.: US 7,805,048 B2
(45) Date of Patent: Sep. 28, 2010

(54) METHODS AND APPARATUS FOR DIRECTING LIGHT EMITTING DIODE OUTPUT LIGHT

(75) Inventors: Ban P. Loh, Durham, NC (US); Nicholas Medendorp, Raleigh, NC (US)

(73) Assignee: Cree, Inc., Durham, NC (US)

( * ) Notice: Subject to any disclaimer, the term of this patent is extended or adjusted under 35 U.S.C. 154(b) by 13 days.

(21) Appl. No.: 11/431,304

(22) Filed: May 10, 2006

(65) Prior Publication Data

US 2007/0274667 A1    Nov. 29, 2007

(51) Int. Cl.
*G02B 6/10* (2006.01)

(52) U.S. Cl. ............. 385/146; 362/311.02; 362/311.07; 385/31; 385/39

(58) Field of Classification Search ............... 385/31, 385/39, 47, 88–94, 146, 147; 359/838, 853, 359/863, 868, 869, 515
See application file for complete search history.

(56) References Cited

U.S. PATENT DOCUMENTS

| | | | |
|---|---|---|---|
| 4,643,545 A * | 2/1987 | Vanderwall | 359/869 |
| 6,274,924 B1 | 8/2001 | Carey et al. | |
| 6,598,998 B2 * | 7/2003 | West et al. | 362/307 |
| 6,607,286 B2 | 8/2003 | West et al. | |
| 7,059,731 B2 * | 6/2006 | Lee et al. | 353/99 |
| 7,182,497 B2 * | 2/2007 | Lee et al. | 362/555 |
| 7,334,923 B2 * | 2/2008 | Tanaka et al. | 362/494 |
| 2006/0034082 A1 * | 2/2006 | Park et al. | 362/268 |
| 2006/0067640 A1 * | 3/2006 | Hsieh et al. | 385/146 |

* cited by examiner

*Primary Examiner*—Sarah Song
(74) *Attorney, Agent, or Firm*—Priest & Goldstein, PLLC

(57) ABSTRACT

Sideways emission enhancements are described for light emitting diode (LED) lighting solutions having a wide variety of applications. While a typical LED lighting device has a substantial portion of its light emitted near a normal to the semiconductor photonic chip emitting the light, the present approach may suitable provide a compact, easily manufacturable device with good thermal design characteristics and a changed emission pattern without changing the horizontal mounting plane of the semiconductor photonic chip.

11 Claims, 9 Drawing Sheets

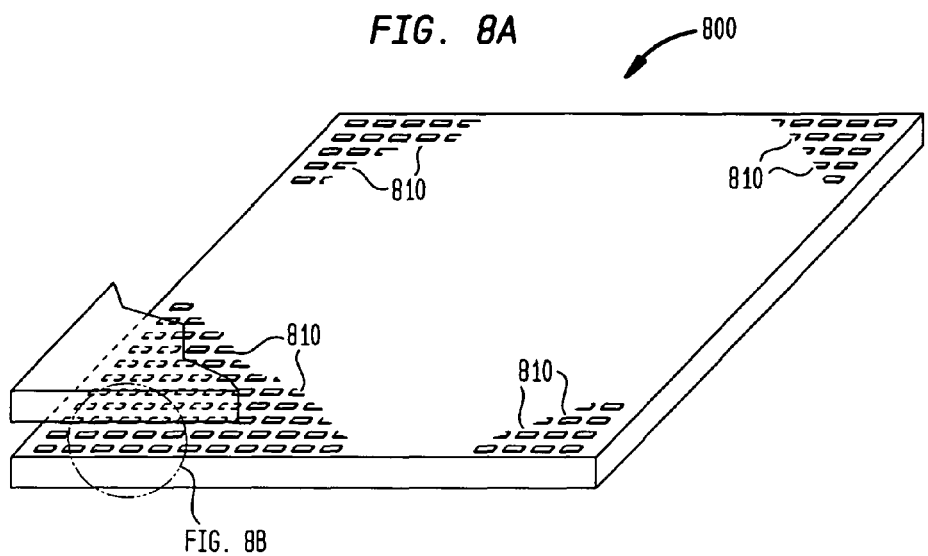
FIG. 8A
FIG. 8B
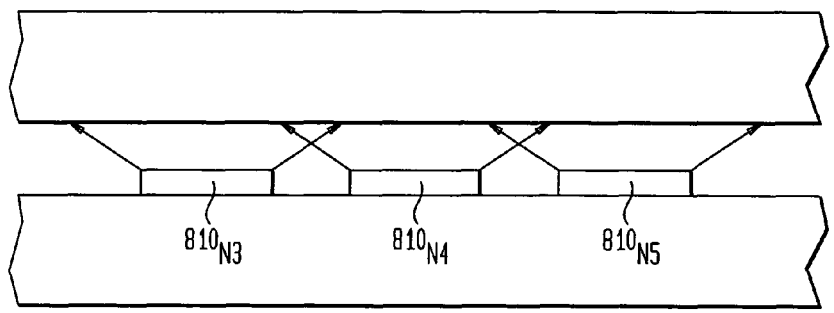
FIG. 8B
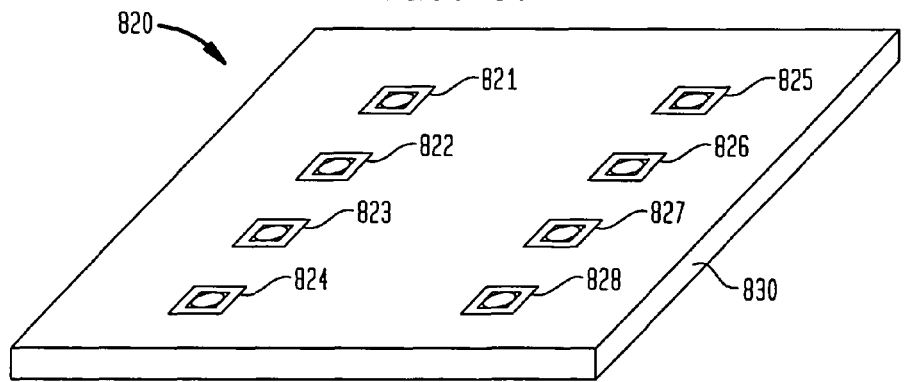
FIG. 8C

METHODS AND APPARATUS FOR DIRECTING LIGHT EMITTING DIODE OUTPUT LIGHT

FIELD OF THE INVENTION

The present invention relates generally to improvements in light emitting diode (LED) packaging and lighting devices. More particularly, the invention relates to advantageous techniques for directing LED output light.

BACKGROUND OF THE INVENTION

As illustrated by FIGS. 1A, 1B and 1C, a common prior art LED mounting arrangement results in a substantial portion of the light output going in a direction parallel to a normal to the top surface of a semiconductor photonic chip 12 as seen in FIG. 1B. As seen in FIG. 1A, a top view of an LED 10, the semiconductor photonic chip 12 is mounted on a substrate 14 which is in turn mounted on a bonding pad 16. The chip 12 is encapsulated beneath an optical lens 18 which focuses the light emitted by the chip 12.

FIG. 1B shows a side view of LED 10 with a plurality of light rays relative to a normal, N, to the top surface of chip 12 illustrating the light emitted by chip 12 as it passes out of lens 18.

FIG. 1C shows an illustrative plot of the light emitted by LED 10 with the y-axis representing the intensity, I, and the x-axis representing the angle, θ, of the emitted light with respect to the normal, N, of FIG. 1B. As illustrated in FIG. 1C, a substantial portion of the light emitted from the LED is along or near the normal, N. Conversely, only a small percentage is emitted sideways. For further details of exemplary prior art LED packages with the bulk of the light intensity emitted near the normal, N, see, for example, the product literature for the XLamp™ 7090 from Cree, Incorporated, as well as that for the LumiBright Light Engine from Innovations in Optics, Inc. The Light Engine product employs a reflective cup which is asserted to direct three times more light into a useable cone angle.

While in some applications it will be recognized that such an emission pattern is advantageous, it will be recognized, however, that for other applications, as discussed further below, it will be desirable to change the light emission pattern. It will further be recognized that good thermal heat dissipation, and ease of manufacture with a small number of parts are also highly desirable.

SUMMARY OF THE INVENTION

To such ends, as addressed in greater detail below, aspects of the present invention address an LED packaging arrangement which may employ a low part count for ease of manufacture. Further aspects address an LED packaging arrangement having good thermal dissipation characteristics. Other aspects address an LED packaging arrangement and a process for making such a package which results in an LED lighting product with a substantial amount of its emitted light emitted in a direction other than normal to the photonic chip, such as sideways.

For example, according to one aspect of the invention, a light emitting diode lighting device comprises a semiconductor photonic chip mounted on a substrate and connected to positive and negative electrodes; a transparent medium having a substantially paraboloid top surface having a focal point, the transparent medium also having a recess to receive the semiconductor photonic chip, wherein the focal point of the paraboloid top surface is substantially centered at the center of the top of the semiconductor photonic chip; and a mirrored surface substantially mating with said paraboloid top surface. It will be recognized as discussed further below, that multiple photonic chips may be employed in place of the single photonic chip in which case those multiple chips are clustered about the focal point.

According to another aspect of the invention, a method of making a light emitting diode lighting device comprises mounting a semiconductor photonic chip on a substrate; connecting the semiconductor photonic chip to positive and negative electrodes; and positioning a transparent medium having a substantially paraboloid top surface having a focal point above the semiconductor photonic chip so that a recess receives the semiconductor photonic chip, and the focal point of the paraboloid top surface is substantially centered at the center of the top surface of the semiconductor photonic chip; and providing a mirrored surface substantially mating with said paraboloid top surface.

As a further example of another aspect of the invention, an array of light devices comprising at least one emission enhanced light emitting diode lighting device comprising: a semiconductor photonic chip mounted on a substrate and connected to positive and negative electrodes; a transparent medium having a substantially paraboloid top surface having a focal point, the transparent medium also having a recess to receive the semiconductor photonic chip, wherein the focal point of the paraboloid top surface is substantially centered at the center of the top surface of the semiconductor photonic chip; and a mirrored surface substantially mating with said paraboloid top surface.

Additionally, a light emitting diode lighting device comprising: a semiconductor photonic chip mounted on a substrate and connected to positive and negative electrodes; and a transparent medium having light redirecting top surface; and a mirrored surface substantially mating with the top surface which redirects a substantial portion of any light emitted by the semiconductor photonic chip away from a normal to the semiconductor photonic chip, the transparent medium also having a recess to receive the semiconductor photonic chip, wherein the light redirecting top surface is positioned above the center of the top of the semiconductor chip.

These and other advantages and aspects of the present invention will be apparent from the drawings and Detailed Description which follow.

BRIEF DESCRIPTION OF THE DRAWINGS

FIGS. 8A and 8B illustrate top and side views of an array of enhanced LED light sources in accordance with the present invention, while FIG. 8C shows a module or tile of multiple enhanced LED light sources for use in the array of FIG. 8A;

DETAILED DESCRIPTION

Figure 1A:
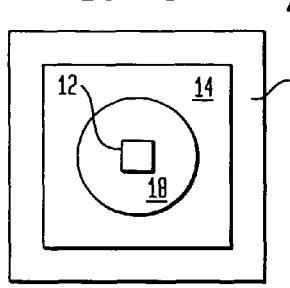
FIGS. 1A-1C are top and side views illustrating aspects of a prior art LED packaging arrangement, and a graph illustrating how the intensity of light emission tends to vary with the angle from normal, respectively.
Figure 1B:
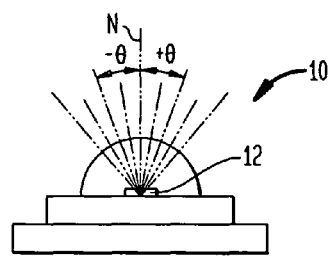
Figure 1C:
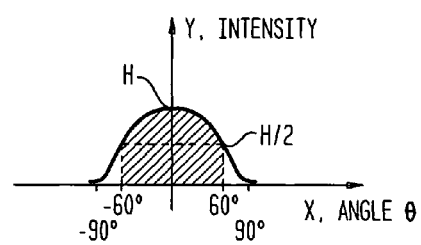
Figure 2:
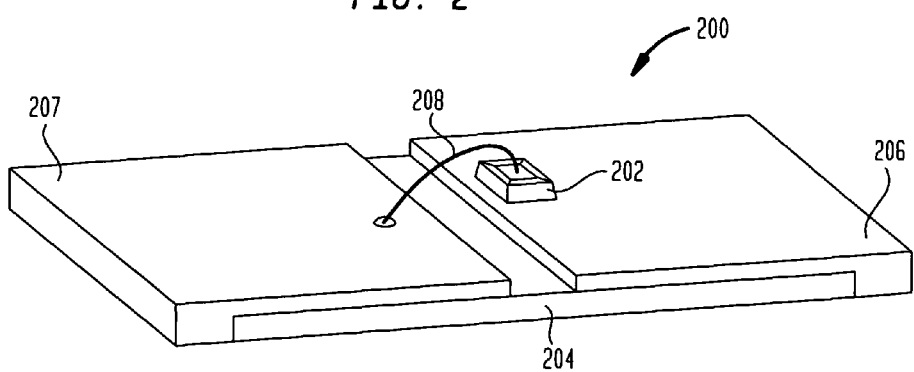
FIG. 2 shows a perspective view of a mounting arrangement for mounting a semiconductor photonic chip on a substrate.

FIG. 2 shows a mounting arrangement 200 for mounting a semiconductor photonic chip 202 on a substrate 204 with conductive electrodes 206 and 207, respectively. The conductive electrodes 206 and 207 may suitably be copper, for example. A bond wire 208 which may suitably be gold wire connects the semiconductor photonic chip 202 to the electrode 207. The substrate 204 may suitably be a ceramic or a plastic, such as a liquid crystal polymer (LCP), which is a dielectric so that it is nonconductive. While plastic is presently preferred as a result of its low cost, it will be recognized other dielectrics may also suitably be employed. The plastic material is molded with electrodes which may be stamped or etched or it is initially laminated with copper which can then be etched to form the electrode arrangement shown in FIG. 2. Again, while copper is presently preferred, it will be recognized that other electrode materials and shapes may be employed so long as suitable current conduction is achieved at an acceptable cost. The copper electrodes may be overcoated with a highly reflective material, such as silver or aluminum.

Figure 3A:
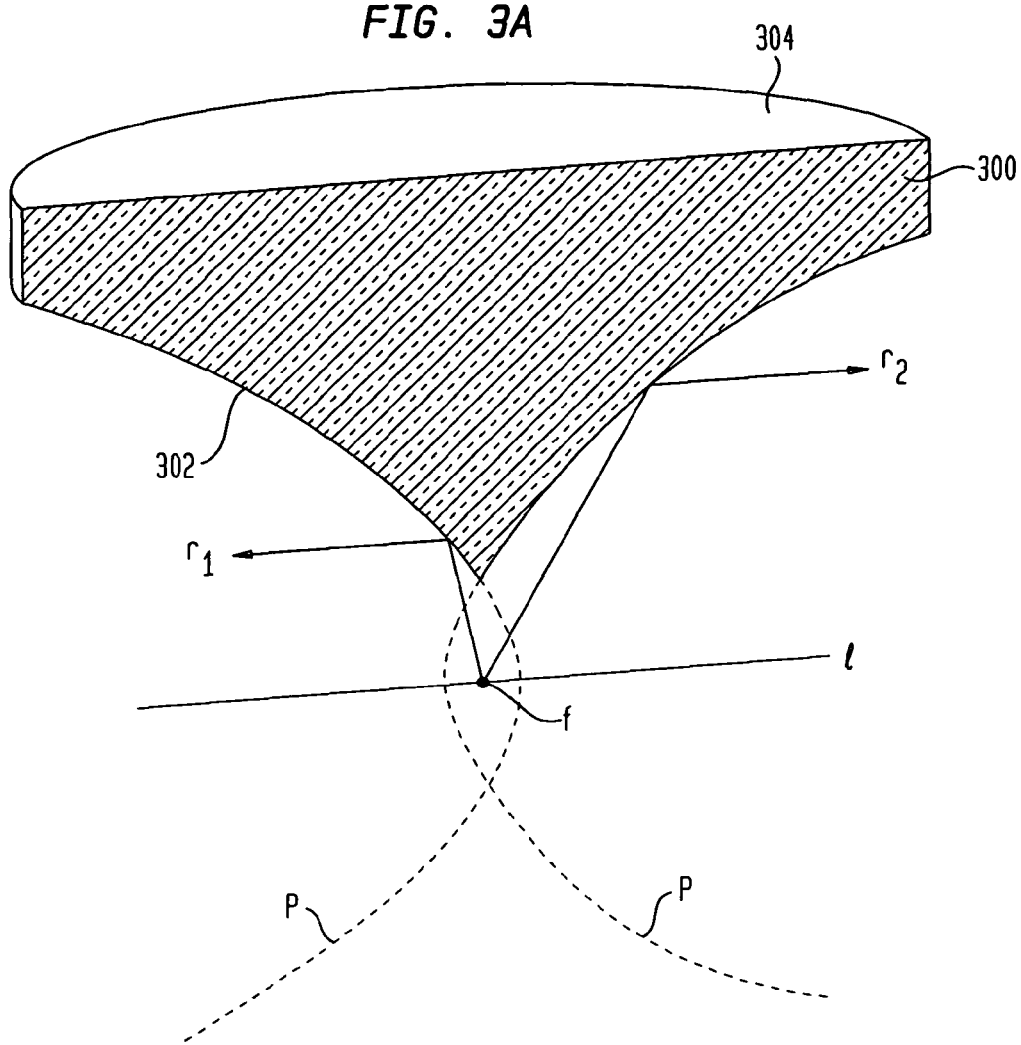
FIGS. 3A and 3C show exemplary reflective members suitable for use in conjunction with the mounting arrangement of FIG. 2 for 360° sideways emission, and 180° sideways emission, respectively.
Figure 4:
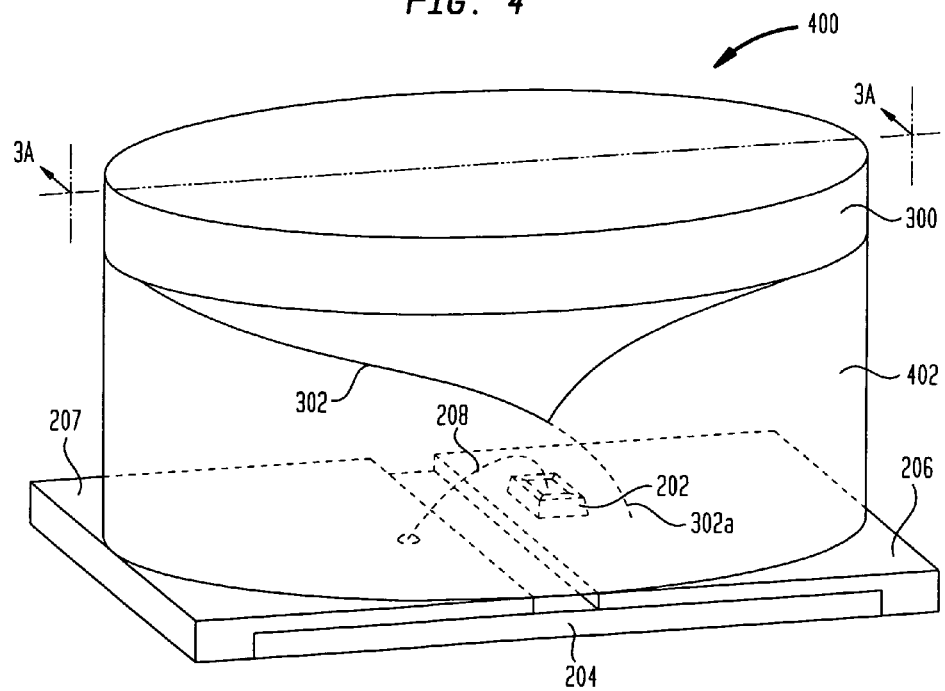
FIG. 4 shows an exemplary LED assembly in accordance with the present invention combining the mounting arrangement of FIG. 1 and the reflective member of FIG. 3.

FIG. 3A shows a cross-sectional view of a reflecting member 300 along line 3A-3A of FIG. 4 which may be suitably used in conjunction with the mounting arrangement 200 to form an LED assembly 400 (shown in FIG. 4) having a substantial sideways emission component in accordance with the present invention as discussed further below. The reflective member 300 has a reflective bottom surface 302 which is preferably a paraboloid surface. By this, it is meant that surface 302 may be envisioned as the surface formed when a parabola, P, is rotated 360° around a focal point, f, in a plane including line l parallel to top surface 304 of reflective member 300. For the member 300 as seen in FIG. 4, the rotation is 360°, but as discussed further below the angle of rotation can be less as desired. For the sake of illustration, the lines representing the surface 302 at the cross-sectional face of member 300 have been extended in dashed lines so parabola, P, can be more readily visualized. It will be recalled that any light emitted from the focal point, f, of a reflective parabola, P, will be reflected sideways parallel to the line, l. Exemplary rays, $r_1$ and $r_2$ are shown to illustrate this reflection principle. Light emitted from near the focal point will be substantially reflected parallel to the line, l.

While a paraboloid reflective surface is presently preferred, it will be recognized that other reflective surfaces may be employed. For example, if ease and reduced cost of manufacturing are considered more important than the effectiveness of the redirection of the emitted light, it will be recognized that a simple surface to manufacture such as an inverted triangle, pyramid or the like may be employed.

Figure 3B:
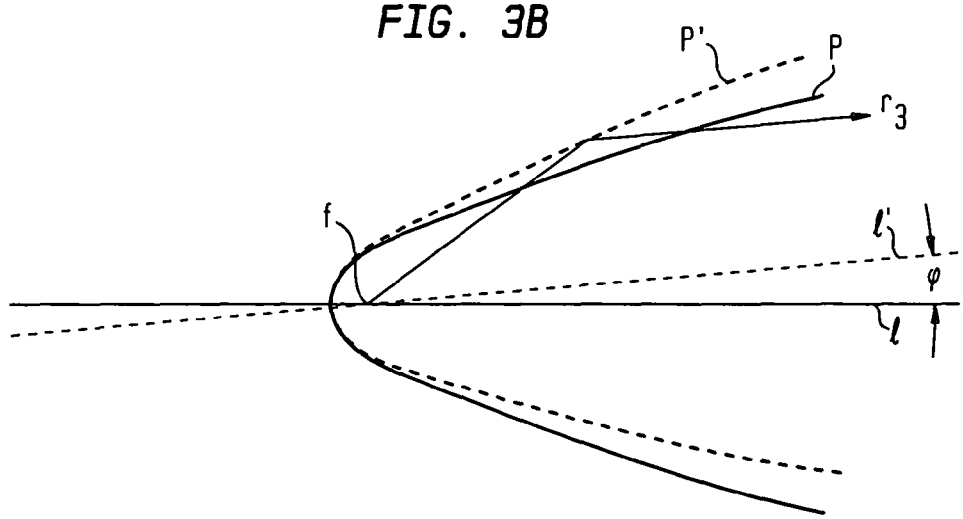
FIG. 3B illustrates how sideways emission can be angled upwards or downwards by varying an angle φ with respect to the plane of mounting of the photonic chip.

As noted above, with line l bisecting parabola P, light will be substantially reflected by reflective parabola P parallel to line l. However, it will be further recognized that parabola P can also be rotated about focal point, f, in a plane through l and perpendicular to top surface 304 so that light will be reflected principally at an angle φ above or below the line l. FIG. 3B shows parabola P rotated by the angle φ in the plane through line l and perpendicular to top surface 304. The plane of line l is also preferably the plane of mounting of the photonic chip as discussed further below. Now a reflective surface P' reflects rays such as $r_3$ parallel to line l'. Thus, it is seen by varying the angle φ in a lighting device as shown in FIG. 4, for example, easy adjustability of the light emission characteristics can be achieved without varying the mounting of the photonic chip.

Member 300 may be satisfactorily formed in a number of manners. For example, it can be stamped from a metal sheet and then plated with silver or aluminum. Alternatively, it may be molded from plastic or glass with a bottom surface 302 having a fine finish and metallized with silver or aluminum so that the end result is a specular mirror surface.

Figure 3C:
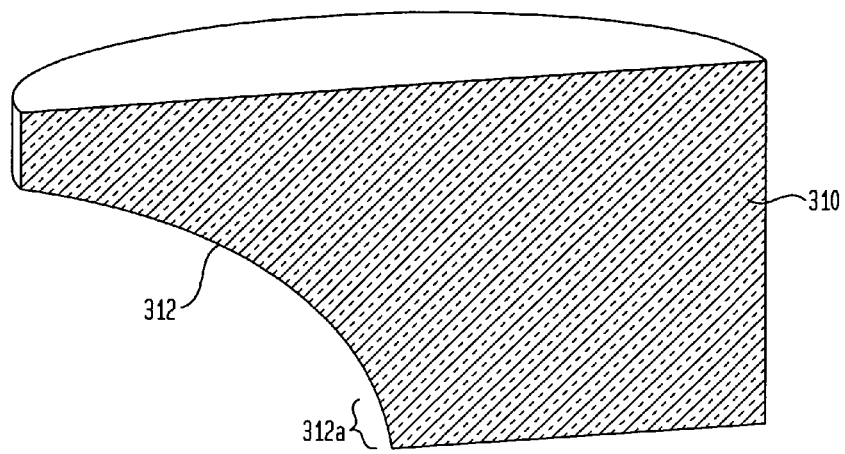

As will be further discussed below in connection with FIGS. 4-7, while in some applications it is desirable to have 360° sideways illumination, where 180°, 90°, or any angle less than 360° sideways illumination is desired, the parabola P only needs to be rotated through the desired degree of rotation. So for 180° sideways illumination, parabola P is rotated 180° to establish a mirrored front surface and a solid mirrored back surface is created as seen in FIG. 3C for 180° member 310. Other surfaces other than parabaloid can be similarly rotated from 10° to 360°, for example.

FIG. 4 shows a perspective view of LED assembly 400. As seen in FIG. 4, reflective member 300 of FIG. 3A has been joined with a transparent medium 402 as discussed further below and mounted on the substrate assembly 200 of FIG. 2 to form an exemplary sideways enhanced emission LED assembly 400 in accordance with the present invention. In this arrangement, the center of the top surface of the semiconductor photonic chip 202 is located substantially at the focal point, f, of parabola P of FIG. 3A. It will be recognized that chip 202 has a top surface with an area such as 1 mm×1 mm so that it is not a point, but by locating the center of the top surface of this chip near the location of the focal point, a highly effective sideways emission will be achieved. In FIG. 4, solid surface line 302 represents a 360° reflective surface while dashed extension 302a represents a 180° rotated paraboloid surface as discussed in conjunction with FIG. 3C above.

The transparent medium 402 may be clear or may be colored or tinted to lend emitted light a desired color. It may be made from silicone, molded plastic, or glass, for example. It is presently preferred that medium 402 have a Shore hardness of approximately 10 through 70 on the D scale. Medium 402 also has a top surface which closely mates with the bottom reflective surface 302 of the reflective member 300. The two pieces are joined together, for example, by a clear adhesive, such as silicone, for example. As an alternative for a two piece construction, the top surface of medium 402 may simply have a reflective coating, such as silver or aluminum coating applied to it as discussed further below in conjunction with the discussion of FIGS. 9A and 9B.

The bottom surface of transparent medium 402 preferably has a recess located over the semiconductor photonic chip 202 and its bond wire 208 which is preferably filled with a soft gel that protects chip 202 and wire 208 from different expansions and contractions of the different parts of assembly 400 as a result of the different coefficients of thermal expansion and contraction of the various components. A presently preferred gel will have a Shore hardness of approximately 30 on the 00 scale. If it is desired to increase the reflectivity of the electrodes 206 and 207, they may be coated or plated with a thin coating of silver or aluminum. A very soft clear adhesive is preferably employed to adhere substrate 200 to the bottom surface of the medium 402.

In a presently preferred approach, the reflective member 300 and transparent medium 402 are glued together with a transparent adhesive. The combined unit is then flipped over so the recess of the bottom surface of the transparent medium 402 is facing up. The recess is filled with the soft gel. The assembly 200 or the remainder of the bottom surface which is now facing up is coated with adhesive. Then, substrate 200 is turned over and aligned with the bottom surface and the two parts are pressed together.

Figure 5:
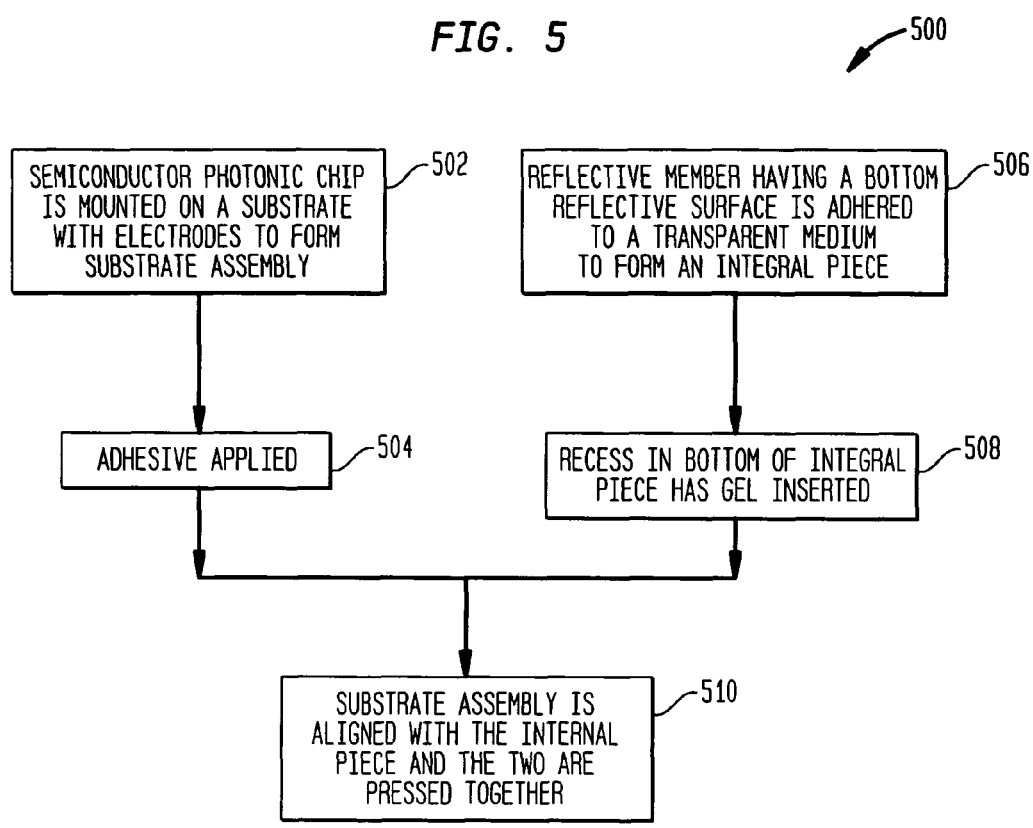
FIG. 5 is a flow chart of a method of making an LED assembly such as the exemplary LED assembly of FIG. 4.

FIG. 5 shows an exemplary process 500 of making an LED assembly, such as the assembly 400 of FIG. 4. In step 502, a semiconductor photonic chip is mounted on a substrate with electrodes to form a substrate assembly. In step 504, an adhesive is selectively applied to the top surface of the substrate assembly. Before, in with parallel or afterwards, in step 506, a reflective member having a bottom reflective surface is adhered to a transparent medium to form an integral piece. As the transparent medium has a recess to receive the semiconductor photonic chip, in step 508, the integral piece is turned over so that its bottom surface faces up and a soft gel to protect against expansion and contraction flowing from different coefficients of thermal expansion and contraction of materials is placed in the recess. In step 510, the substrate assembly is aligned with the integral piece and pressed together therewith and the adhesive is allowed to cure. While an exemplary process is described, it will be recognized that many variations therein will be apparent to those of ordinary skill in the art based upon the teachings herein, the wide variety of lighting applications to be addressed, and subsequent improvements in the art relative to materials such as adhesives, plastics, glasses and other components used to form light devices.

In a presently preferred embodiment, the bottom reflective surface is a paraboloid and the semiconductor photonic chip is located substantially at the focal point of the paraboloid. While a paraboloid surface is recognized as highly effective in directing light sideways, it will be recognized that a straight line surface, such as an inverted triangle or pyramid, substantially paralleling a tangent of such a surface will work; however, less effectively.

As a further step of method 500, a substrate with copper electrodes may be plated with silver or aluminum to increase the reflectivity of the top surface of substrate assembly.

Figure 6:
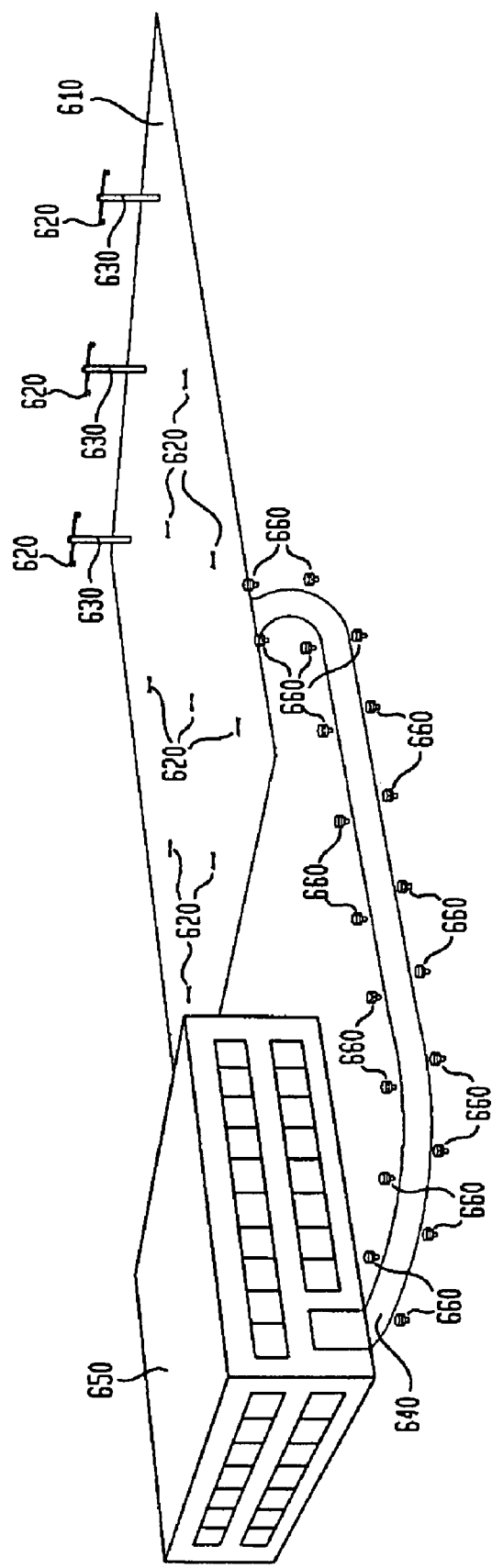
FIG. 6 shows an exemplary embodiment of a lighting application utilizing an LED light source in accordance with the present invention.
Figure 7:
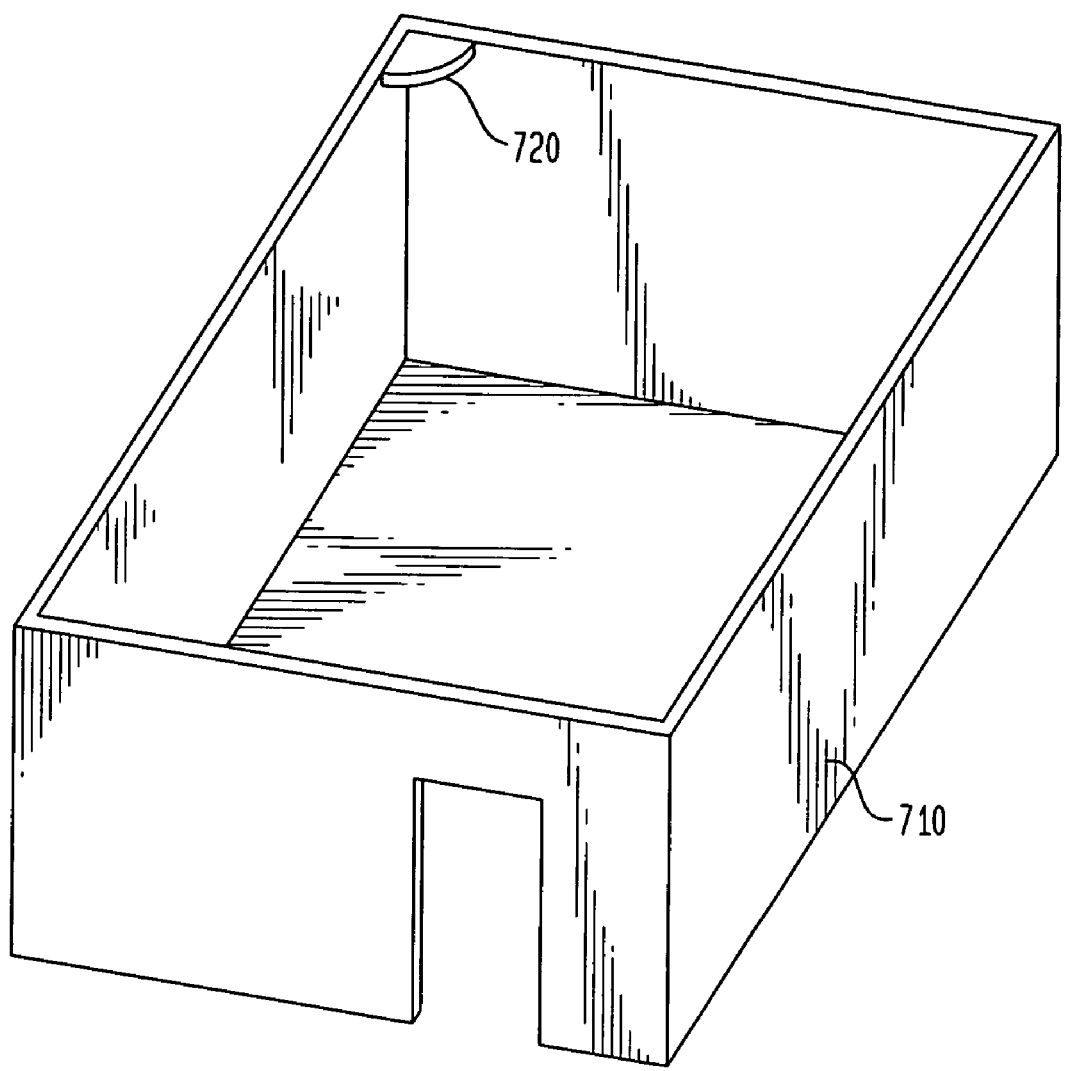
FIG. 7 shows an alternative exemplary embodiment of a lighting application utilizing an LED light source in accordance with the present invention.

FIGS. 6-8 illustrate various exemplary applications for LED assemblies utilizing the teachings of the present invention. FIG. 6 illustrates schematically a parking lot 610 with a large number of lights 620 on tall poles 630. The lights along one edge of the parking lot 610 are shown representatively while other lights are simply indicated with an "x" to mark their location. A walkway 640 is shown extending from the parking lot 610 and leading to an event center 650, such as a museum. Alongside the walkway 640 are a plurality of low lights 660 at knee height or lower to light the walkway.

While the lights 620 represented by an "x" might be good candidates for a 360° sideways light assembly in accordance with the present invention, the lights 620 shown at the top edge of the parking lot 610 are a good candidate for a 180° sideways light assembly in accordance with the present invention. This desirability of application is particularly appropriate in the case where a housing development has grown up just on the other side of a lightly forested area between it and the parking lot 610. By more efficiently directing the emitted light inward towards the parking lot, the present invention helps the parking lot's owner to be a better neighbor.

FIG. 7 shows an exemplary application of a 90° sideways enhanced emission LED light source 720 in accordance with the present invention. FIG. 7 shows schematically a corner mounting arrangement for a light in a room 710. It will be apparent that more light emitted in a 90° radius from the corner in which light source 720 is mounted will be advantageous.

FIGS. 8A and 8B show a perspective view and side view, respectively, of a flat panel back lighting arrangement 800 in accordance with the present invention. FIGS. 8A and 8B illustrate aspects of an array 810 of light devices for backlighting a flat panel liquid crystal display 800. The array 810 comprises an N×M matrix of light devices one or more of which may be sideways enhanced LEDs in accordance with the invention, such as LEDs $810_{N3}$, $810_{N4}$, $810_{N5}$ shown schematically in FIG. 8B. It will be recognized that corner LEDs may have the 90° enhancement discussed above. Edge LEDs may have 180° enhancement and middle LEDs may have 360° enhancement. Also, upwards angling may be advantageously employed to achieve a desired overlap.

FIG. 8C shows a module or tile arrangement 820 in which a 4×2 array of LEDs 821, 822, 823, 824, 825, 826, 827 and 828 is shown mounted on a common substrate 830, such as a printed circuit board. Each of the four LEDs defining a column, 821, 822, 823, and 824; and 825, 826, 827 and 828, respectively, may be electrically serially connected while the two columns are electrically connected in parallel. Alternatively, it will be recognized that other electrical connections may be chosen depending upon the application. Some or all of the LEDs 821-828 may suitably be enhanced LEDs as taught herein. It will be recognized that a module or tile arrangement could vary in the number of rows, columns and total number of LEDs as desired for a particular application, and that arrangement 820 is merely exemplary. With modules or tiles, it will be recognized that LEDs on an edge might be 180° enhanced and corner modules might have 90° enhancement.

Figure 9A:
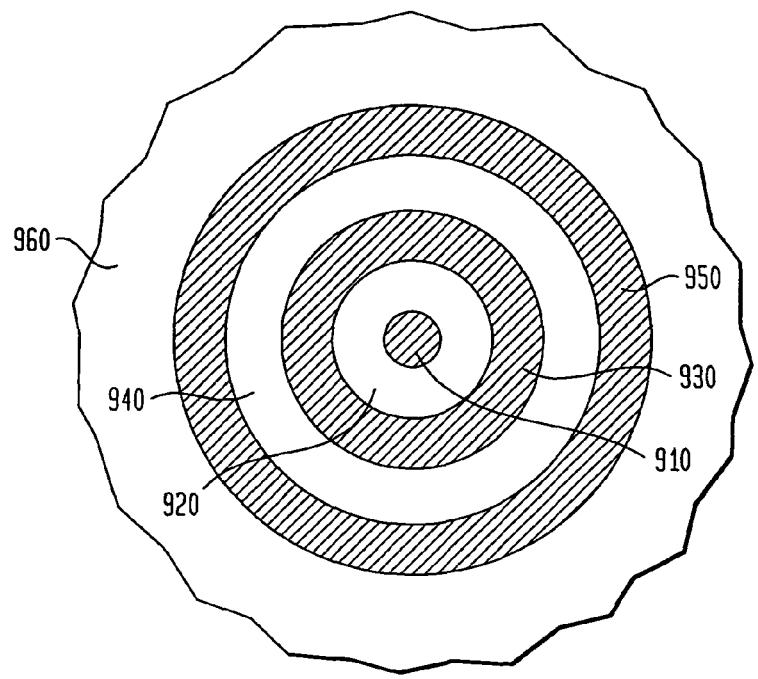
FIGS. 9A and 9B show top and side views, respectively, of an alternative transparent medium.
Figure 9B:
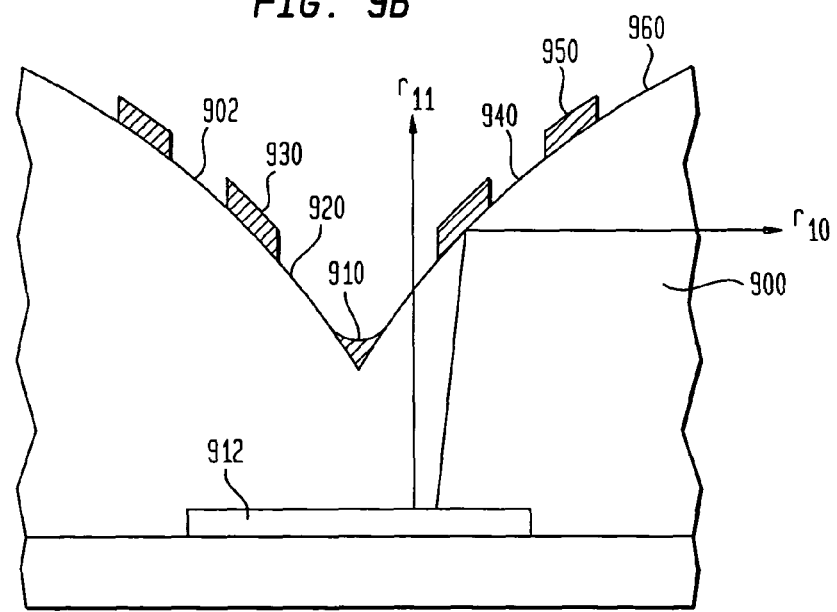

FIGS. 9A and 9B show top and side views, respectively, of an alternative embodiment of a transparent medium 900 providing both emission along the normal and sideways as discussed further below. The transparent medium 900 has a 360° paraboloid top surface 902 as discussed above. As previously discussed, the focal point is substantially centered at the center of the top of semiconductor photonic chip 912 in a finished device. The top surface 902 also has a plurality of reflectively coated and clear bands 910, 930 and 950 and 920, 940 and 960, respectively. The reflective bands 910, 930 and 950 result in an enhanced sideways emission while the clear bands 920, 940 and 960 allow a portion of the light intensity emitted by the photonic chip to be emitted upwards. For example, as seen in FIG. 9B, first ray $r_{10}$ is reflected sideways by reflective band 930 while second $ray_{11}$ passes upwards through clear band 920. It will be recognized that by controlling the widths and shapes of the bands 910-960 improved control and design of patterns of light emission can be achieved.

Figure 10:
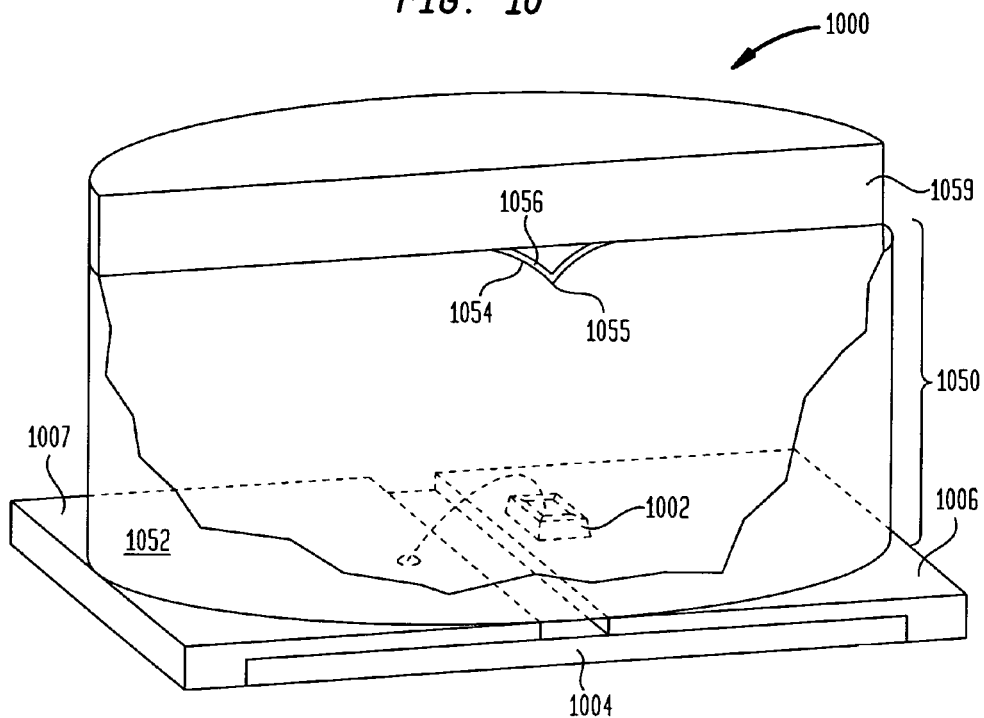
FIG. 10 shows a perspective view of an alternative LED assembly.

FIG. 10 shows a perspective view of an alternative LED assembly 1000. As seen in FIG. 10, a reflective member 1050 has been formed as discussed further below and mounted on a substrate assembly, like substrate assembly 200 of FIG. 2, to form a further exemplary LED assembly 1000 in accordance with the present invention. In this arrangement, the center of the top surface of a semiconductor photonic chip 1002 is located substantially at the focal point f, of a parabola, such as parabola P of FIG. 3A, but as will be discussed further below the parabola P of FIG. 10 is truncated when compared to parabola P. It will be recognized that chip 1002 has a top surface with an area such as 1 mm×1 mm so that it is not a point, but by locating the center of the top surface of this chip near the location of the focal point, a highly effective sideways emission will be achieved.

A transparent medium 1052 may be clear or may be colored or tinted to lend emitted light a desired color. It may be made from silicone, molded plastic, or glass, for example. In this embodiment, it is presently preferred that medium 1052 be made of glass. Medium 1052 has a top surface which is flat over most its extent, but has a portion 1054 which is paraboloid. The paraboloid portion 1054 is centered above the center of the top surface of photonic chip 1002 and extends a desired predetermined distance beyond the outer boundary of photonic chip 1002. For example, if photonic chip 1002 has top surface area of 1 mm×1 mm, then the paraboloid surface may extend 2 mm or further out from point 1055. Surface 1054 has a reflective coating 1056. On top of medium 1052, there is a flat layer of glass 1059 having an index of reflection different from that of medium 1052 so that incident light at an angle less than the critical angle is internally reflected and directed sideways out the sides of medium 1052 with high efficiency in a manner similar to that observed in optical fiber light transmission. The two pieces 1052 and 1059 are joined together, for example, by a clear adhesive, such as silicone, for example. As an alternative, the piece 1059 may have a paraboloid bottom surface mating with surface 1054 with this bottom surface having a silver or aluminum coating applied to it as discussed above.

The bottom surface of transparent medium 1052 preferably has a recess located over the semiconductor photonic chip 1002 and its bond wire 10. This recess is preferably filled with a soft gel that protects chip 1002 and wire 1008 from different expansions and contractions of the different parts of assembly 1000 as a result of the different coefficients of thermal expansion and contraction of the various components. A presently preferred gel will have a Shore hardness of approximately 30 on the 00 scale. If it is desired to increase the reflectivity of electrodes 1006 and 1007, they may be coated or plated with a thin coating of silver or aluminum. A very soft clear adhesive is preferably employed to adhere substrate 1000 to the bottom surface of the medium 1050.

The reflective member 1052 and piece 1059 are glued together with a transparent adhesive to form a combined medium 1050. The combined unit is then flipped over so the recess in the bottom surface of the transparent medium 1052 is facing up. The cored out portion is filled with the soft gel. The remainder of the bottom surface which is now facing up is coated with adhesive. Then, substrate 1000 is turned over and aligned with the bottom surface and the two parts are pressed together. It will be recognized a one piece medium 1050 could also be employed.

Figure 11:
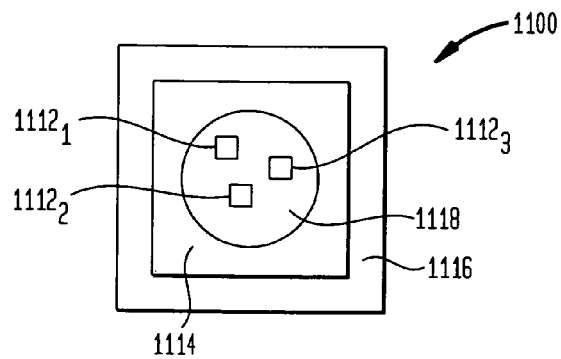
FIG. 11 shows a multiple photonic chip light source which may suitably be used in conjunction with the present invention.

While the above discussion has focused on embodiments in which a single photonic chip is located under a reflective member, such as member 300, it will be recognized that more than one photonic chip may be mounted on a substrate to increase the light emitted, to blend colors, or the like, and that multiple photonic chips may be located under a reflective member. FIG. 11 shows a multiple photonic chip light source 1100 in which three chips $1112_1$, $1112_2$ and $1112_3$ are mounted on a substrate 1114 which is in turn mounted on a bonding pad 1116. An optional lens 1118 may be used to focus the light output. While three chips are shown for purposes of illustration, two, four or more chips might suitably be employed. In one embodiment, the multiple chips $1112_1$, $1112_2$ and $1112_3$ replace single chip 202 in FIG. 2. In another embodiment, these multiple chips replace the chip 1002 in FIG. 10. In these arrangements, any chip or chips might not be located at the focal point of the parabola, but the chips would typically be clustered at or about this point.

While the present invention has been disclosed in the context of various aspects of presently preferred embodiments, it will be recognized that the invention may be suitably applied to other environments consistent with the claims which follow.

We claim:

1. A light emitting diode lighting device comprising:
a semiconductor photonic chip mounted on a substrate and connected to positive and negative electrodes;
a transparent medium on the substrate; and
a banded mirror arrangement comprising at least two mirrored bands separated by a gap, the banded mirror arranged above the transparent medium, the bands substantially conforming to segments of a paraboloid surface formed by rotating a parabola having a focal point through an angle of rotation of up to 360° around an axis of rotation passing through the focal point to, the mirrored bands redirecting a portion of light emitted by the semiconductor photonic chip substantially perpendicular to the axis of rotation and away from a normal to the semiconductor chip.

2. The device of claim 1 further comprising:
a transparent adhesive to join the substrate and the transparent medium together.

3. The device of claim 1 further comprising:
a gel placed in the recess of the transparent medium to reduce thermal stresses on the semiconductor photonic chip.

4. The device of claim 1 wherein the mirrored surface comprises a highly reflective coating applied to a top surface of the transparent medium.

5. The device of claim 1 wherein the mirrored surface comprises a reflective member having a highly reflective bottom surface which mates with a paraboloid top surface of the transparent medium.

6. The device of claim 1 wherein the transparent medium is tinted.

7. The device of claim 1 wherein the shape of the substantially paraboloid top surface is formed by rotating an axis of the parabola in a plane parallel a mounting plane of the semiconductor photonic chip.

8. The device of claim 1 wherein said angle of rotation is approximately 180°.

9. The device of claim 1 wherein said angle of rotation is approximately 90°.

10. The device of claim 1 wherein the parabola is rotated upwards or downwards by an angle φ above or below a mounting plane of the semiconductor photonic chip where φ is in a range from −60° to +60°.

11. A light emitting diode lighting device comprising:
a semiconductor photonic chip mounted on a substrate and connected to positive and negative electrodes;
a transparent medium on the substrate; and
a banded mirror arrangement comprising at least two mirrored bands separated by a gap, the banded mirror arranged above the transparent medium, the bands substantially conforming to segments of a curved surface, the mirrored bands redirecting a portion of light emitted by the semiconductor photonic chip away from a normal to the semiconductor chip.

* * * * *